(12) United States Patent
Clark, Jr. et al.

(10) Patent No.: US 8,575,668 B2
(45) Date of Patent: Nov. 5, 2013

(54) CHARGE BREAKDOWN AVOIDANCE FOR MIM ELEMENTS IN SOI BASE TECHNOLOGY AND METHOD

(75) Inventors: William F. Clark, Jr., Essex Junction, VT (US); Stephen E. Luce, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 105 days.

(21) Appl. No.: 13/116,416

(22) Filed: May 26, 2011

(65) Prior Publication Data

US 2011/0221030 A1 Sep. 15, 2011

Related U.S. Application Data

(62) Division of application No. 12/046,560, filed on Mar. 12, 2008, now Pat. No. 7,977,200.

(51) Int. Cl.
*H01L 27/108* (2006.01)
*H01L 29/94* (2006.01)

(52) U.S. Cl.
USPC .................... 257/296; 257/300; 257/306

(58) Field of Classification Search
USPC ............................ 257/296, 300, 306
See application file for complete search history.

(56) References Cited

U.S. PATENT DOCUMENTS

| | | |
|---|---|---|
| 5,811,857 A | 9/1998 | Assaderaghi et al. |
| 6,130,458 A | 10/2000 | Takagi et al. |
| 6,465,830 B2 | 10/2002 | Babcock et al. |
| 6,528,366 B1 | 3/2003 | Tu et al. |
| 6,703,285 B2 | 3/2004 | Arakawa et al. |
| 6,720,232 B1 | 4/2004 | Tu et al. |
| 6,821,839 B2 | 11/2004 | Chung |
| 7,071,507 B2 | 7/2006 | Diorio et al. |
| 7,141,853 B2 | 11/2006 | Campbell et al. |
| 7,217,602 B2 | 5/2007 | Koh |
| 7,226,816 B2 | 6/2007 | Bertin et al. |
| 2005/0176184 A1 | 8/2005 | Okihara |
| 2006/0128109 A1 | 6/2006 | Phan et al. |
| 2007/0080387 A1 | 4/2007 | Liu et al. |
| 2007/0194390 A1 | 8/2007 | Chinthakindi et al. |
| 2008/0173981 A1 | 7/2008 | Chinthakindi et al. |
| 2011/0086487 A1* | 4/2011 | Baumgartner et al. ....... 438/381 |

OTHER PUBLICATIONS

Roberts et al., "Application of on-chip MIM decoupling capacitor for 90nm SOI microprocessor," Freescale Semiconductor Inc., IEEE, 2005, 4 pages.

Plouchart, J.O. et al., "Application of an SOI o.12-μm CMOS technology to SoCs with low-power and high-frequency circuits", Sep./Nov. 2003, IBM J. Res. & Dev., vol. 47, No. 5/6, pp. 611-629.

Kim, J. et al., "3-Dimensional Vertical Parallel Plate Capacitors in an SOI CMOS Technology for Integrated RF Circuits", 2003 Symposium on VLSI Circuits Digest of Technical Papers, 4 pages.

* cited by examiner

*Primary Examiner* — Long K Tran
(74) *Attorney, Agent, or Firm* — Anthony Canale; Roberts Mlotkowski Safran & Cole, P.C.

(57) ABSTRACT

A semiconductor device including at least one capacitor formed in wiring levels on a silicon-on-insulator (SOI) substrate, wherein the at least one capacitor is coupled to an active layer of the SOI substrate. A method of fabricating a semiconductor structure includes forming an SOI substrate, forming a BOX layer over the SOI substrate, and forming at least one capacitor in wiring levels on the BOX layer, wherein the at least one capacitor is coupled to an active layer of the SOI substrate.

18 Claims, 6 Drawing Sheets

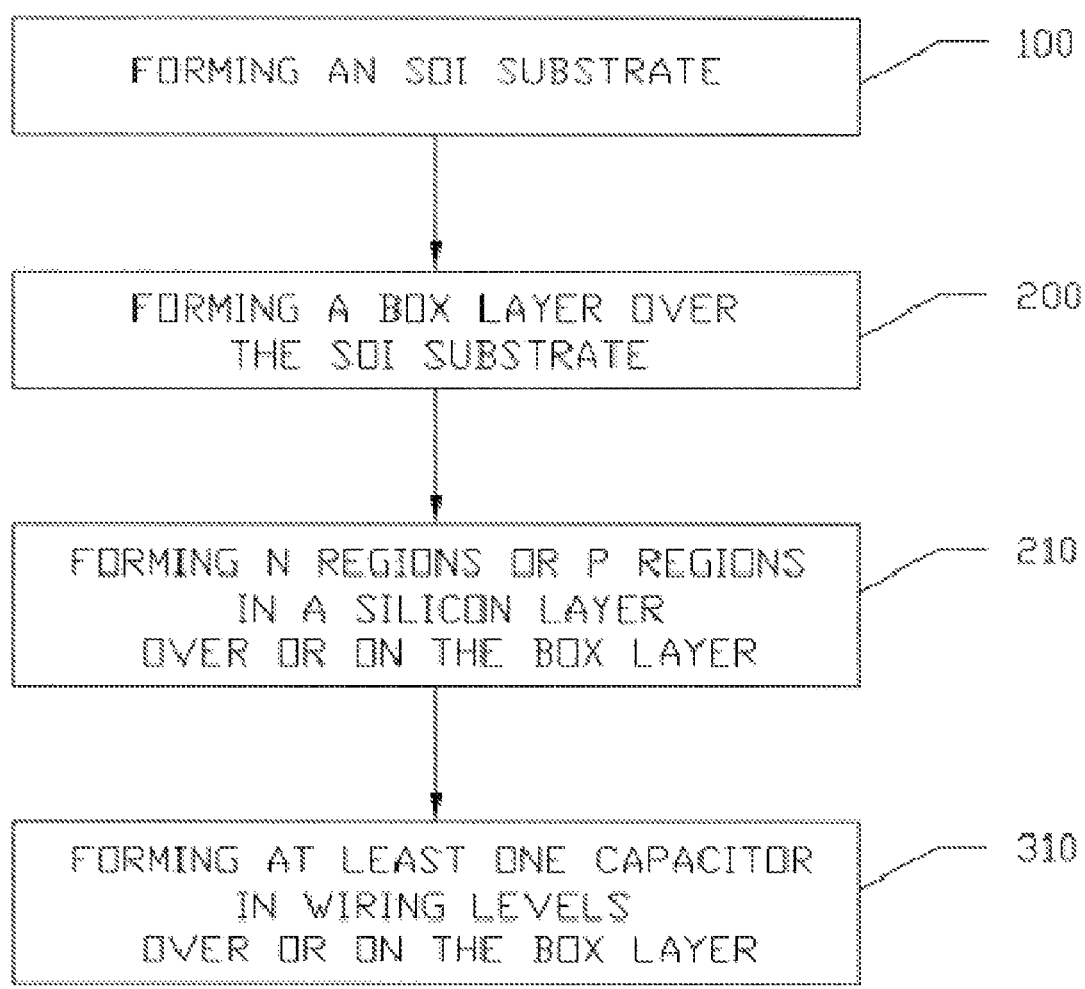

US 8,575,668 B2

CHARGE BREAKDOWN AVOIDANCE FOR MIM ELEMENTS IN SOI BASE TECHNOLOGY AND METHOD

CROSS REFERENCE TO RELATED APPLICATION

This application is a divisional of U.S. application Ser. No. 12/046,560, filed Mar. 12, 2008, the contents of which are incorporated by reference herein in their entirety.

FIELD OF THE INVENTION

The invention generally relates to a semiconductor device and methods for manufacturing a semiconductor device with improved device performance, and more particularly to a semiconductor device having at least one capacitor (e.g. MIM cap or VPP cap) formed in wiring levels on an SOI substrate, wherein the capacitor is coupled to an active layer of the SOI substrate.

BACKGROUND OF THE INVENTION

A conventional semiconductor device includes an SOI substrate having embedded therein n+ regions. One or more capacitors are arranged in wiring levels over the n+ regions with one plate of the capacitor arranged in a wiring level, e.g., Mx, and another plate of the capacitor arranged in another or lower wiring level, e.g., Mx−1. The plates of the capacitor are connected to the n+ regions via, e.g., wires, via stacks, etc.

Interest has been expressed in installing a metal-on-insulator (MIM) capacitor element into silicon-on-insulator (SOI) technology base. The basic MIM as practiced in bulk technology requires tying both ends of the MIM plates to reverse bias junction in the substrate to eliminate potential charging effects which could damage the MIM. In SOI these diffusions are isolated so an alternate protection scheme is required.

Accordingly, there exists a need in the art to overcome the deficiencies and limitations described hereinabove.

SUMMARY

In a first aspect of the invention, there is provided a semiconductor structure comprising at least one capacitor formed in wiring levels on a silicon-on-insulator (SOI) substrate, wherein the at least one capacitor is coupled to an active layer of the SOI substrate.

In a second aspect of the invention, there is a semiconductor structure comprising a silicon-on-insulator (SOI) substrate, a buried oxide (BOX) formed on the SOI substrate, and at least one capacitor formed in wiring levels on the silicon-on-insulator (SOI) substrate, wherein the at least one capacitor is coupled to an active layer of the SOI substrate.

In a third aspect of the invention, there is a method of fabricating a semiconductor structure comprising forming an SOI substrate, forming a BOX layer over the SOI substrate, and forming at least one capacitor in wiring levels on or over the BOX layer, wherein the at least one capacitor is coupled to an active layer of the SOI substrate.

BRIEF DESCRIPTION OF THE DRAWINGS

FIGS. 3-6 show embodiments of methods of making semiconductor device according to aspects of the invention.

DETAILED DESCRIPTION

The invention is directed to a semiconductor device and methods for manufacturing a semiconductor device with improved device performance, and more particularly to a semiconductor device comprising at least one capacitor (e.g., metal-on-insulator (MIM) cap or vertical-parallel-plate (VPP) cap) formed in wiring levels on a silicon-on-insulator (SOI) substrate. In embodiments, the capacitor is coupled to an active layer of the SOI substrate.

The invention is also directed to a semiconductor device wherein the MIM plates are tied to a back-to-back lateral diode circuit, whereby capacitor breakdown is clamped to a base-to-emitter voltage (VBE) above diode breakdown. The diode can be further tuned, as needed, with additional processing. Preferably, the wire runs are made as symmetrical as possible in order to minimize asymmetric charging effects caused by different via and wire topology between the cap leads.

In an embodiment of the invention, a MIM cap is formed in wiring levels on an SOI substrate and the MIM cap is coupled to a voltage clamp device formed on a silicon active layer of the SOI substrate. The voltage clamp device can comprise a back-to-back lateral diode with an internal terminal coupled to ground, or a body contacted field effect transistor (FET). As a result, the MIM capacitor breakdown voltage is clamped to a VBE (about 0.7 volts) above the voltage clamp device breakdown voltage (about 8 volts for a back-to-back lateral diode, and about 3-4 volts for a body-contacted FET).

Figure 1:
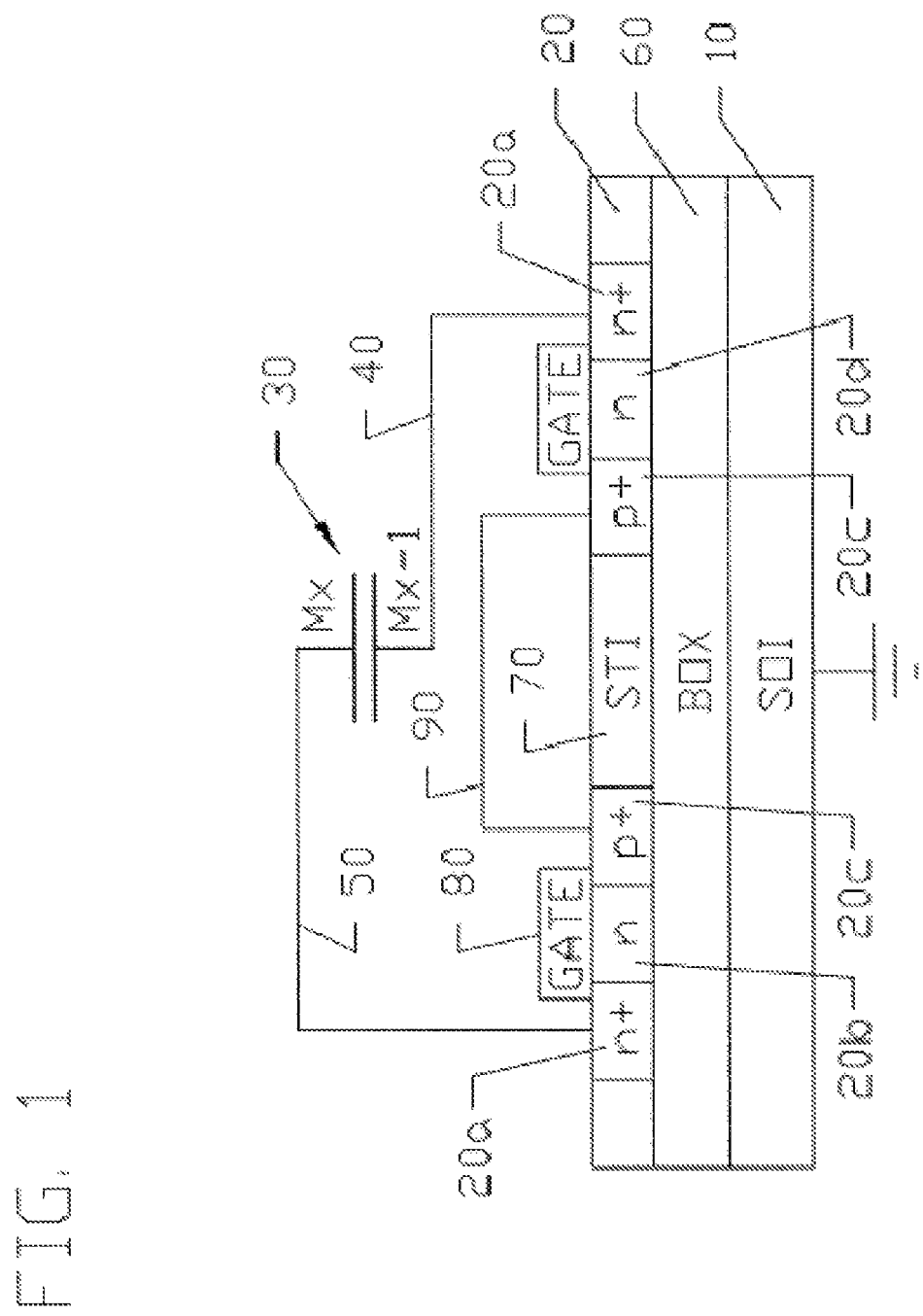
FIG. 1 shows one embodiment of a semiconductor device according to aspects of the invention.

FIG. 1 shows one exemplary substrate structure according to the invention. More particularly, a silicon-on-insulator (SOI) type substrate structure is shown. The SOI structure has an SOI substrate 10. A buried oxide (BOX) layer 60 is formed on the substrate 10. A semiconductor layer 20, which can be a silicon layer, is formed on the buried oxide layer 60, and is isolated from the SOI layer 10 by the BOX layer 60. The semiconductor layer 20 may be comprised of various semiconductor materials, such as, for example, Si, SiGe, SiC, SiGeC, etc. The substrate 10 may be fabricated using techniques well know to those skilled in the art. For example, the substrate 10 may be formed by conventional bonding and cutting processes, or alternatively, a conventional separation by implantation of oxygen (SIMOX) process. The substrate 10 may have any desired thickness based upon the intended use of the final semiconductor device. In embodiments, the BOX layer 60 has a thickness of between about 100 nanometers (nm) to about 200 nm, and the semiconductor layer arranged above the BOX layer 60 can have a thickness of between about 10 nm to about 100 nm.

As can be seen in FIG. 1, the semiconductor layer 20 includes an n+ region 20a and a p+ region 20c with an n-type region 20b arranged therebetween, as well as p+ region 20c and an n+ region 20a with an n-type region 20b arranged therebetween. These regions are lateral structures. A shallow-trench-isolation structure (STI) 70 is arranged between these regions. Additionally, polysilicon gates 80, which can be formed by a layer of polysilicon over an oxide layer, are arranged on the semiconductor layer with one gate 80 arranged over the n+ region, n-type region, and p+ region, and with another gate 80 arranged over the p+ region, n-type region, and n+ region. The gates 80 can of course be nFETs and/or pFETs. Techniques known in the art may be utilized to form the gates, STI region 70, as well as the n+, p+, the n-type, and p-type regions. Such conventional techniques include patterning with a photoresist, etching, chemical vapor deposition, and planarizing such as by chemical mechanical polishing.

Again, with reference to FIG. 1, one or more capacitors 30 are arranged in wiring levels over the gates 80 with one plate of the capacitor 30 arranged in a wiring level above the gates 80, e.g., an Mx wiring level, and another plate of the capacitor 30 arranged in another or lower wiring level, e.g., an Mx−1 wiring level. The plates of the capacitor 30 are connected to the n+ regions 20a via connections 40 and 50. These connections 40, 50 can be, e.g., wires, via stacks, etc., and are preferably made of copper. The capacitor(s) 30 can be connected in series or parallel and can be arranged in multiple wiring levels arranged above the polysilicon gates 80. Finally, one or more wires 90 form connections between the p+ regions 20c that are separated by the STI region 70. The wire(s) 90 can be arranged in a wiring level, e.g., an M1 wiring level, and can preferably be made of, e.g., tungsten.

The capacitor 30 can be a metal-on-insulator (MIM) capacitor. Alternatively, the capacitor 30 can be a vertical-parallel-plate (VPP) capacitor. The capacitor can also be a metal-on-insulator (MIM) capacitor with MIM plates of the MIM capacitor being tied to a back-to-back lateral diode circuit, whereby capacitor breakdown is clamped to a base-to-emitter voltage (VBE) above diode breakdown. The capacitor 20 can also be connected to the active layer 20 with substantially symmetrical wire runs or leads, whereby asymmetric charging effects caused by different via and wire topology are minimized. Still further, the capacitor 30 can be a MIM capacitor formed in wiring levels that is coupled to a voltage clamp device formed on the active layer of the SOI substrate 10. The voltage clamp device can be a back-to-back lateral diode with an internal terminal coupled to ground.

A breakdown voltage of the MIM capacitor can be clamped to a VBE of about 0.7 volts above the voltage clamp device breakdown voltage of about 8 volts for the back-to-back lateral diode. The voltage clamp device can comprise a body contacted field effect transistor (FET). Alternatively, a breakdown voltage of the MIM capacitor can be clamped to a VBE of about 0.7 volts above the voltage clamp device breakdown voltage of about 3-4 volts for the body-contacted FET.

Figure 2:
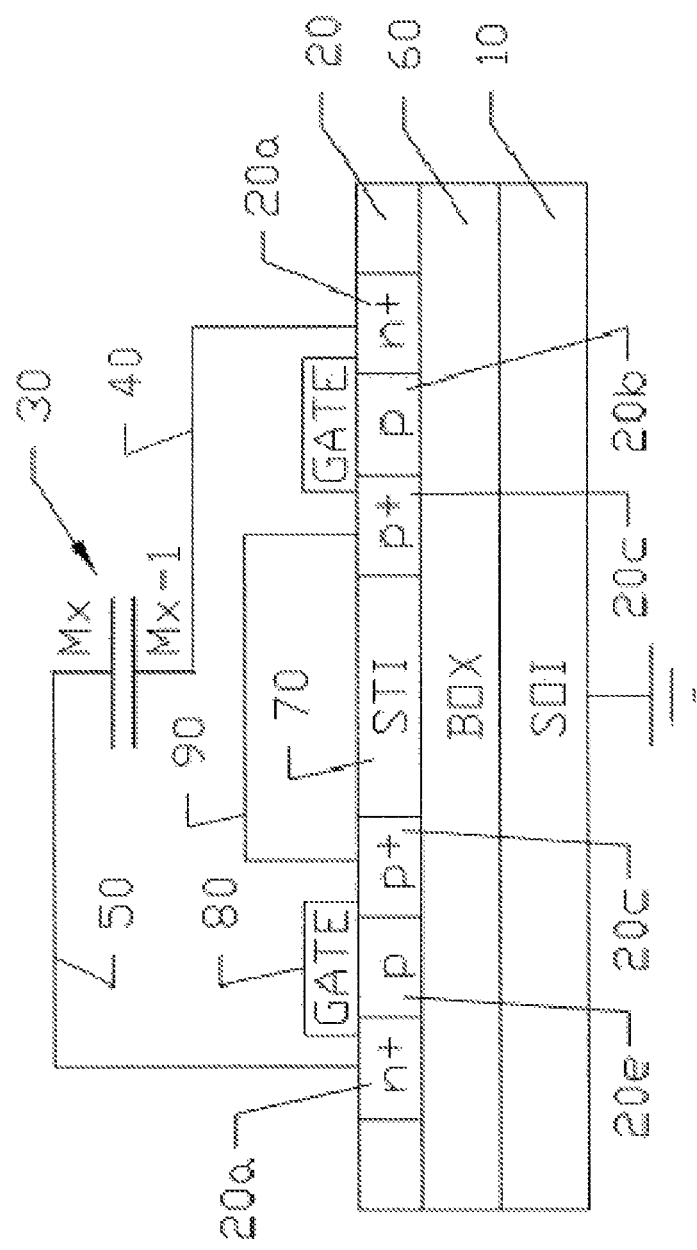
FIG. 2 shows another embodiment of a semiconductor device according to aspects of the invention.

FIG. 2 shows another exemplary substrate structure according to the invention. More particularly, a silicon-on-insulator (SOI) type substrate structure is shown. The SOI structure has an SOI substrate 10. A buried oxide (BOX) layer 60 is formed on the substrate 10. A semiconductor layer 20, which can be a silicon layer, is formed on the buried oxide layer 60, and is isolated from the SOI layer 10 by the BOX layer 60. The semiconductor layer 20 may be comprised of various semiconductor materials, such as, for example, Si, SiGe, SiC, SiGeC, etc. The substrate 10 may be fabricated using techniques well know to those skilled in the art. For example, the substrate 10 may be formed by conventional bonding and cutting processes, or alternatively, a conventional separation by implantation of oxygen (SIMOX) process. The substrate 10 may have any desired thickness based upon the intended use of the final semiconductor device. In embodiments, the BOX layer 60 has a thickness of between about 100 nanometers (nm) to about 200 nm, and the semiconductor layer arranged above the BOX layer 60 can have a thickness of between about 10 nm to about 100 nm.

As can be seen in FIG. 2, semiconductor layer 20 includes an n+ region 20a and a p+ region 20c with an p-type region 20d arranged therebetween, as well as p+ region 20c and an n+ region 20a with an p-type region 20d arranged therebetween. These regions are lateral structures. A shallow-trench-isolation structure (STI) 70 is arranged between these regions. Additionally, polysilicon gates 80, which can be formed by a layer of polysilicon arranged over an oxide layer, are arranged on the semiconductor layer with one gate 80 arranged over the n+ region 20a, p-type region 20d, and p+ region 20c, and with another gate 80 arranged over the p+ region 20c, p-type region 20d, and n+ region 20a. The gates 80 can of course be nFETs and/or pFETs. Techniques known in the art may be utilized to form the gates, STI region 70, as well as the n+, the p+, the n-type, and the p-type regions. Such conventional techniques include patterning with a photoresist, etching, chemical vapor deposition, and planarizing such as by chemical mechanical polishing.

Again, with reference to FIG. 2, one or more capacitors 30 are arranged in wiring levels over the gates 80 with one plate of the capacitor 30 arranged in a wiring level above the gates 80, e.g., an Mx wiring level, and another plate of the capacitor 30 arranged in another or lower wiring level, e.g., an Mx−1 wiring level. The plates of the capacitor 30 are connected to the n+ regions 20a via connections 40 and 50. These connections 40, 50 can be, e.g., wires, via stacks, etc, and are preferably made of copper. The capacitor(s) 30 can be connected in series or parallel and can be arranged in multiple wiring levels arranged above the polysilicon gates 80. Finally, one or more wires 90 form connections between the p+ regions 20c that are separated by the STI region 70. The wire(s) 90 can be arranged in a wiring level, e.g., an M1 wiring level, and can preferably be made of, e.g., tungsten.

The capacitor 30 in embodiments can be a metal-on-insulator (MIM) capacitor. Alternatively, the capacitor 30 can be a vertical-parallel-plate (VPP) capacitor. The capacitor 30 can also be a metal-on-insulator (MIM) capacitor with MIM plates of the MIM capacitor being tied to a back-to-back lateral diode circuit, whereby capacitor breakdown is clamped to a base-to-emitter voltage (VBE) above diode breakdown. The capacitor 30 can also be connected to the active layer with substantially symmetrical wire runs or leads, whereby asymmetric charging effects caused by different via and wire topology are minimized. Still further, the capacitor 30 can be a MIM capacitor formed in wiring levels that is coupled to a voltage clamp device formed on the active layer of the SOI substrate 10. The voltage clamp device can be a back-to-back lateral diode with an internal terminal coupled to ground.

A breakdown voltage of the MIM capacitor can be clamped to a VBE of about 0.7 volts above the voltage clamp device breakdown voltage of about 8 volts for the back-to-back lateral diode. The voltage clamp device can comprise a body contacted field effect transistor (FET). Alternatively, a breakdown voltage of the MIM capacitor can be clamped to a VBE of about 0.7 volts above the voltage clamp device breakdown voltage of about 3-4 volts for the body-contacted FET.

Figure 3:
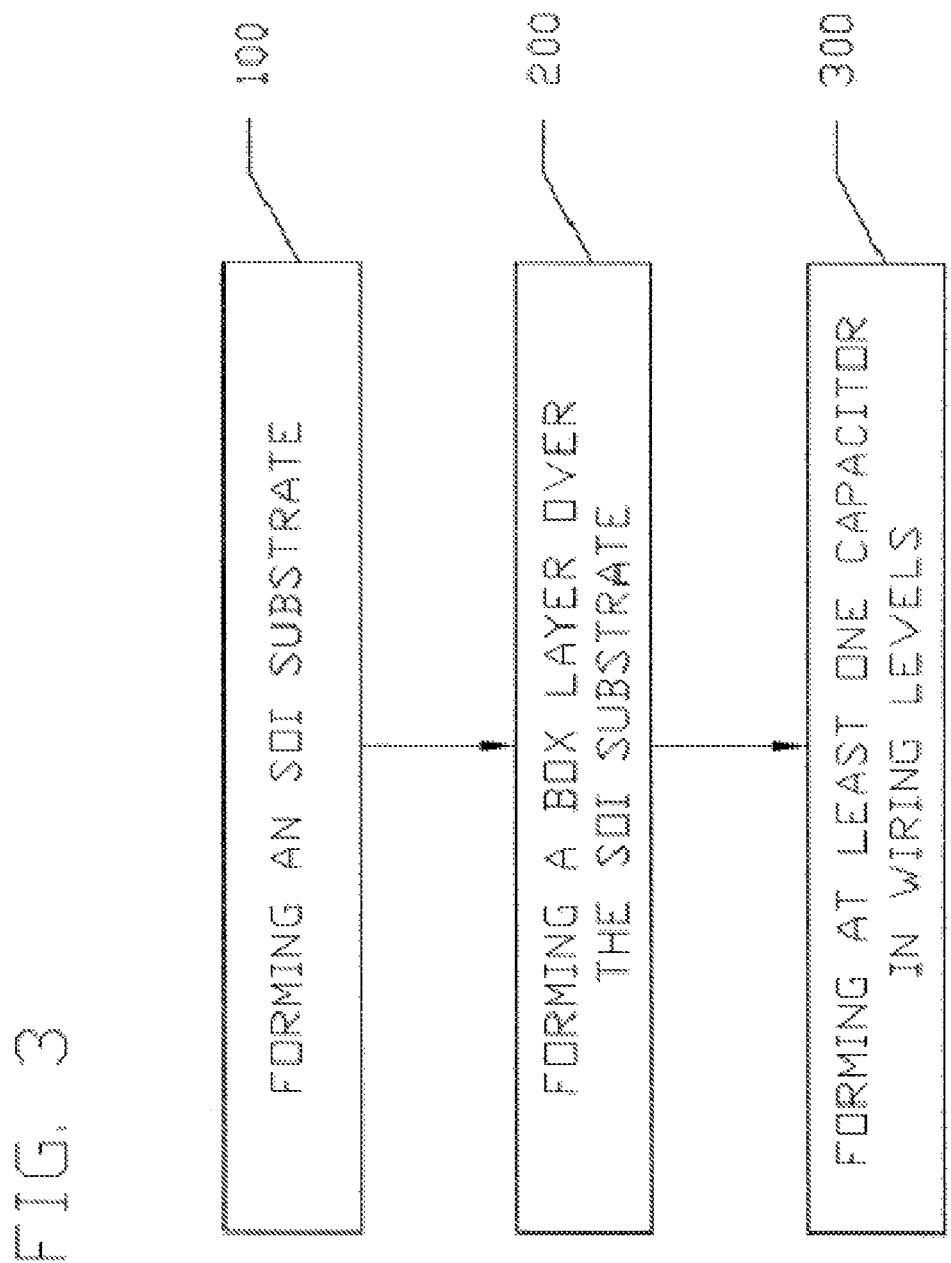

With reference to FIG. 3, there is shown one non-limiting method of making a semiconductor device which includes the step of forming an SOI substrate in step 100. This is followed by forming a BOX layer over the SOI substrate in step 200. Thereafter, at least one capacitor is formed in wiring levels in step 300.

Figure 4:
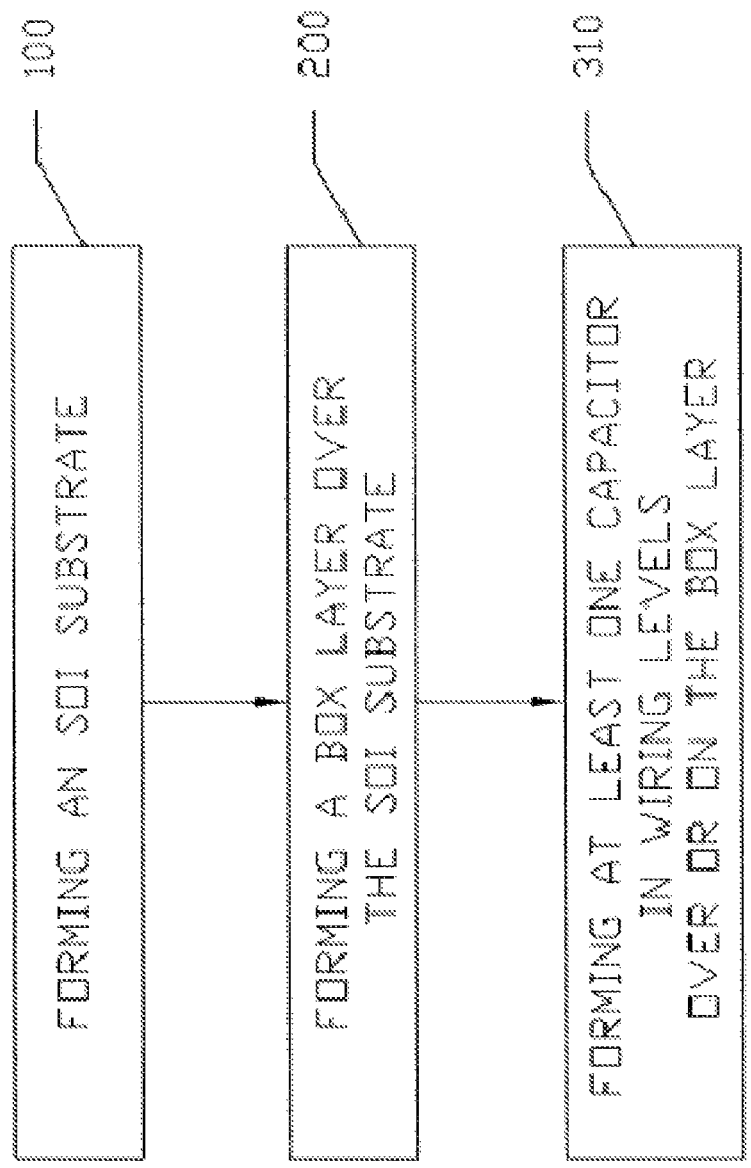

With reference to FIG. 4, there is shown another non-limiting method of making a semiconductor device which includes the step of forming an SOI substrate in step 100. This is followed by forming a BOX layer over the SOI substrate in step 200. Thereafter, at least one capacitor is formed in wiring levels over or on the BOX layer in step 310.

Figure 5:
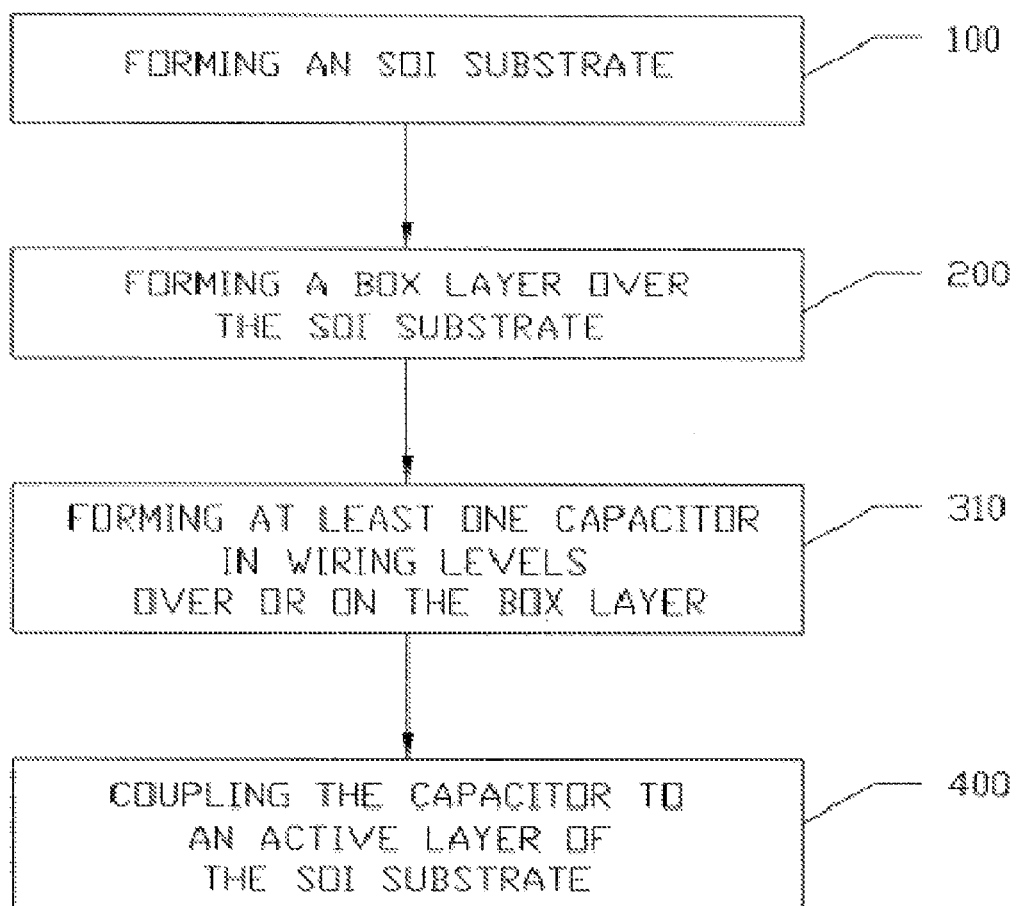

With reference to FIG. 5, there is shown another non-limiting method of making a semiconductor device which includes the step of forming an SOI substrate in step 100. This is followed by forming a BOX layer over the SOI substrate in step 200. Thereafter, at least one capacitor is formed in wiring levels over or on the BOX layer in step 310. Finally, the at least one capacitor is coupled to the active layer of the SOI substrate in step 400. In embodiments, the at least one capacitor can be at least one MIM capacitor formed in wiring levels over or on the BOX layer. The MIM capacitor can be coupled to the active layer of the SOI substrate. Alternatively, the at least one capacitor can be at least one VPP capacitor formed in wiring levels over or on the BOX layer in step 330. The VPP capacitor can be coupled to the active layer of the SOI substrate.

With reference to FIG. 6, there is shown another non-limiting method of making a semiconductor device which includes the step of forming an SOI substrate in step 100. This is followed by forming a BOX layer over the SOI substrate in step 200. Thereafter, "n" and/or "p" regions are form in a silicon layer over or on the BOX layer in step 210. Finally, at least one capacitor is formed in wiring levels over or on the BOX layer in step 310. At least one capacitor can then be coupled to the active layer of the SOI substrate in an additional step that is not shown. In embodiments, the at least one capacitor can be at least one MIM capacitor formed in wiring levels over or on the BOX layer. The MIM capacitor can be coupled to the active layer of the SOI substrate. Alternatively, the at least one capacitor can be at least one VPP capacitor formed in wiring levels over or on the BOX layer. The VPP capacitor can be coupled to the active layer of the SOI substrate.

The devices and methods as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the invention has been described in terms of embodiments, those skilled in the art will recognize that the invention can be practiced with modifications and in the spirit and scope of the appended claims.

What is claimed:

1. A semiconductor structure, comprising:
   at least one capacitor formed in wiring levels on a silicon-on-insulator (SOI) substrate, which is coupled to an active layer of the SOI substrate, wherein the at least one capacitor is a metal-on-insulator (MIM) capacitor and wherein MIM plates of the MIM capacitor are tied to a back-to-back lateral diode circuit, whereby capacitor breakdown is clamped to a base-to-emitter voltage (VBE) above diode breakdown.

2. The structure of claim 1, wherein the at least one capacitor is connected to the active layer with substantially symmetrical wire runs or leads, whereby asymmetric charging effects caused by different via and wire topology are minimized.

3. The structure of claim 1, wherein the MIM capacitor is formed in wiring levels and the active layer of the SOI substrate comprises a silicon active layer.

4. The structure of claim 1, wherein the MIM capacitor formed in wiring levels and the MIM capacitor is coupled to a voltage clamp device is formed on the active layer of the SOI substrate.

5. The structure of claim 4, wherein the voltage clamp device comprises the back-to-back lateral diode with an internal terminal coupled to ground.

6. The structure of claim 5, wherein a breakdown voltage of the MIM capacitor is clamped to a VBE of about 0.7 volts above the voltage clamp device breakdown voltage of about 8 volts for the back-to-back lateral diode.

7. The structure of claim 4, wherein a breakdown voltage of the MIM capacitor is clamped to a VBE of about 0.7 volts above the voltage clamp device breakdown voltage of about 3-4 volts for the body-contacted FET.

8. The structure of claim 1, wherein first and second capacitor plates of the at least one capacitor are coupled to the active layer of the SOI substrate.

9. The structure of claim 1, further comprising:
   a first lateral diode in the active layer of the SOI substrate, wherein a first plate of the at least one capacitor is connected by first wiring to the first lateral diode; and
   a second lateral diode in the active layer of the SOI substrate, wherein a second plate of the at least one capacitor is connected by second wiring to the second lateral diode.

10. The structure of claim 9, further comprising:
    an isolation region between the first lateral diode and the second lateral diode; and
    third wiring connecting the first lateral diode to the second lateral diode.

11. The structure of claim 1, further comprising:
    a first lateral structure in the active layer of the SOI substrate and comprising a first n+ region, a first n-type region contacting the first n+ region, and a first p+ region contacting the first n-type region, wherein a first plate of the at least one capacitor is connected by first wiring to the first n+ region; and
    a second lateral structure in the active layer of the SOI substrate and comprising a second n+ region, a second n-type region contacting the second n+ region, and a second p+ region contacting the second n-type region, wherein a second plate of the at least one capacitor is connected by second wiring to the second n+ region.

12. The structure of claim 1, further comprising:
    a first lateral structure in the active layer of the SOI substrate and comprising a first n+ region, a first p-type region contacting the first n+ region, and a first p+ region contacting the first p-type region, wherein a first plate of the at least one capacitor is connected by first wiring to the first n+ region; and
    a second lateral structure in the active layer of the SOI substrate and comprising a second n+ region, a second p-type region contacting the second n+ region, and a second p+ region contacting the second p-type region, wherein a second plate of the at least one capacitor is connected by second wiring to the second n+ region.

13. A semiconductor structure, comprising:
    a silicon-on-insulator (SOI) substrate;
    a buried oxide (BOX) layer formed on the SOI substrate; and
    at least one capacitor formed in wiring levels on the silicon-on-insulator (SOI) substrate, wherein the at least one capacitor is coupled to an active layer of the SOI substrate,
    wherein the at least one capacitor is a metal-on-insulator (MIM) capacitor and wherein MIM plates of the MIM capacitor are tied to a back-to-back lateral diode circuit, whereby capacitor breakdown is clamped to a base-to-emitter voltage (VBE) above diode breakdown.

14. The structure of claim 13, wherein the at least one capacitor is connected to the active layer with substantially symmetrical wire runs or leads, whereby asymmetric charging effects caused by different via and wire topology are minimized.

15. The structure of claim 13, wherein the MIM capacitor is formed in wiring levels and the active layer of the SOI substrate comprises a silicon active layer.

16. The structure of claim 13, wherein the MIM capacitor is formed in wiring levels and the MIM capacitor is coupled to a voltage clamp device formed on the active layer of the SOI substrate.

17. The structure of claim 16, wherein: the voltage clamp device comprises the back-to-back lateral diode with an internal terminal coupled to ground, and a breakdown voltage of the MIM capacitor is clamped to a VBE of about 0.7 volts above the voltage clamp device breakdown voltage of about 8 volts for the back-to-back lateral diode.

18. The structure of claim 13, wherein first and second capacitor plates of the at least one capacitor are coupled to the active layer of the SOI substrate.

* * * * *